(12) United States Patent
Jang

(10) Patent No.: US 6,436,758 B1
(45) Date of Patent: Aug. 20, 2002

(54) METHOD FOR FORMING STORAGE NODE CONTACT PLUG OF DRAM (DYNAMIC RANDOM ACCESS MEMORY)

(75) Inventor: Soon-Kyou Jang, Seoul (KR)

(73) Assignee: Samsung Electronics Co., Ltd., Suown (KR)

( * ) Notice: Subject to any disclaimer, the term of this patent is extended or adjusted under 35 U.S.C. 154(b) by 0 days.

(21) Appl. No.: 09/349,709

(22) Filed: Jul. 8, 1999

(30) Foreign Application Priority Data

Jul. 13, 1998 (KR) .............................. 98-28194

(51) Int. Cl.⁷ .......................................... H01L 21/302
(52) U.S. Cl. ................. 438/241; 438/725; 438/734; 438/694; 438/723; 438/743; 438/238; 438/586; 438/253; 438/254; 438/255; 438/256
(58) Field of Search ................. 438/241, 253, 438/254, 255, 256, 238, 586, 725, 734, 694, 723, 473

(56) References Cited

U.S. PATENT DOCUMENTS 5,629,539 A * 5/1997 Aoki et al. ................. 357/306
5,687,111 A * 11/1997 Wada et al. ................. 365/154
5,702,982 A * 12/1997 Lee et al. .................... 437/195
5,780,331 A * 7/1998 Liaw et al. .................. 438/228

FOREIGN PATENT DOCUMENTS

JP          10-200067        *  7/1998

* cited by examiner

Primary Examiner—George Goudreau
(74) Attorney, Agent, or Firm—Lee & Sterba, P.C.

(57) ABSTRACT

A method for forming a storage node contact plug of a dynamic random access memory includes forming insulating layers on an overall surface of a semiconductor substrate having a plurality of buried contact plugs, etching the insulating layers down to a top surface of the buried contact plugs to form first contact holes on the buried contact plugs, forming a photoresist pattern on the insulating layers and the first contact holes, etching the insulating layers to form second contact holes on the second insulating layer, and filling the first and second contact holes with conductive material.

15 Claims, 11 Drawing Sheets

METHOD FOR FORMING STORAGE NODE CONTACT PLUG OF DRAM (DYNAMIC RANDOM ACCESS MEMORY)

BACKGROUND OF THE INVENTION

1. Field of the Invention

The present invention relates to a method for fabricating a semiconductor device and, more particularly, to a method for forming a storage node contact opening for a dynamic random access memory (DRAM).

2. Description of the Related Art

Figure 1:
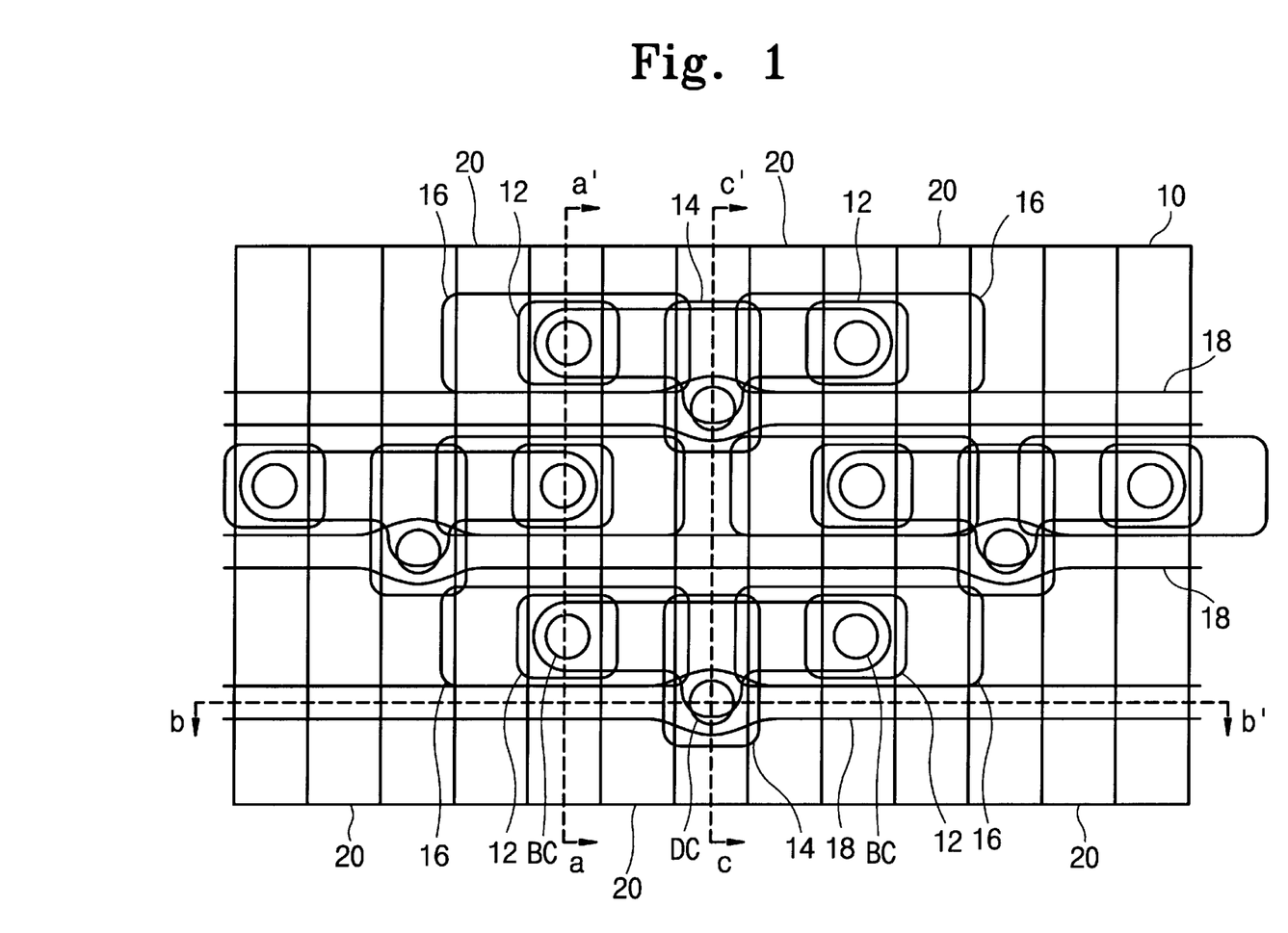
FIG. 1 is a layout illustrating a structure of a dynamic random access memory (DRAM)

In FIG. 1, a semiconductor substrate 10 is shown. A plurality of parallel gate electrode lines 20 with predetermined spacing, and a plurality of parallel bit lines 18 perpendicular to the gate electrode lines 20 and with predetermined spacing are arranged on the semiconductor substrate 10. Between each of the gate electrode lines 20 are conductive plugs (or landing pads) 12 for storage nodes (or conductive pads) 16 and conductive plugs 14 for a bit lines 18. Each of the storage nodes 16 is electrically connected through a buried contact (referred to below as a "BC") to a conductive plug 12. Each of the bit lines 18 is electrically connected through a direct contact (referred to below as a "DC") to a conductive plug 14. A memory cell formed on semiconductor substrate 10 comprises a storage node 16, a conductive plug 14 for a bit line 18, and an electrode line 20 interposed therebetween.

Figure 2A:
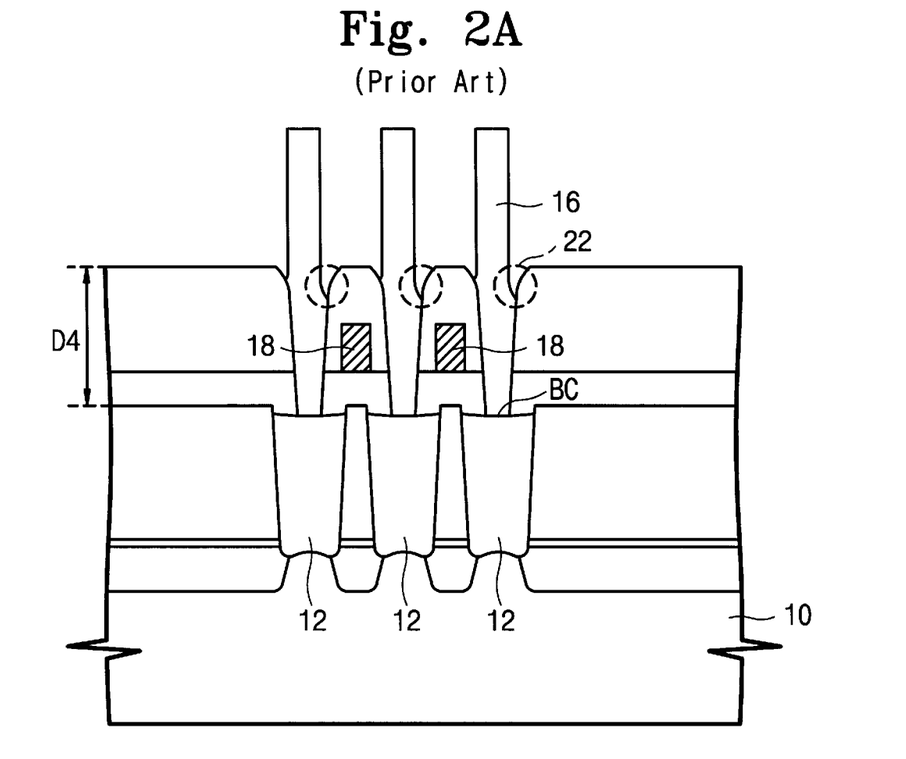
FIGS. 2A–2C are sectional views illustrating a method for fabricating a DRAM according to a prior art method, taken along lines a–a', b–b', and c–c' of FIG. 1.
Figure 2B:
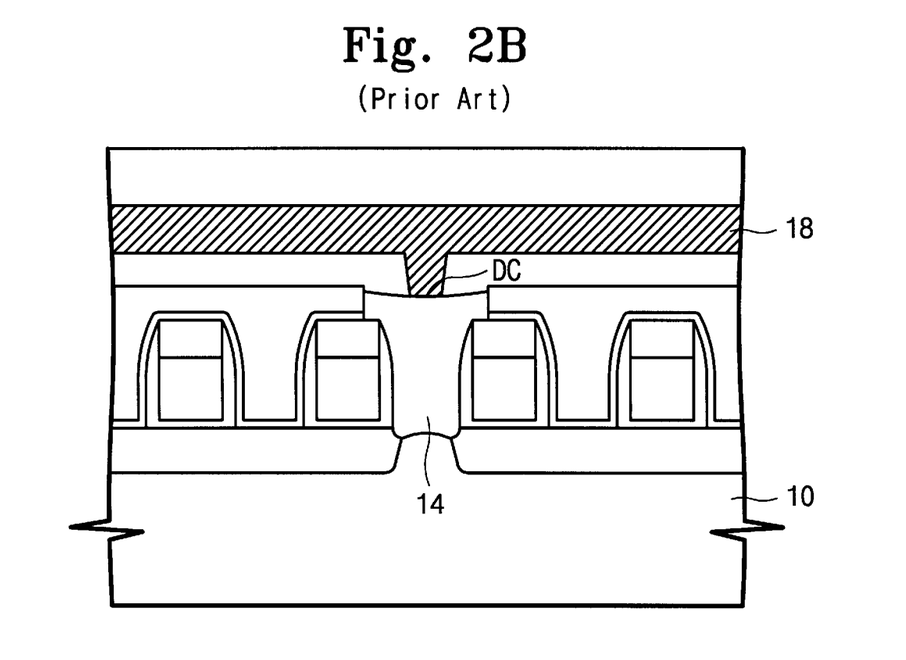
Figure 2C:
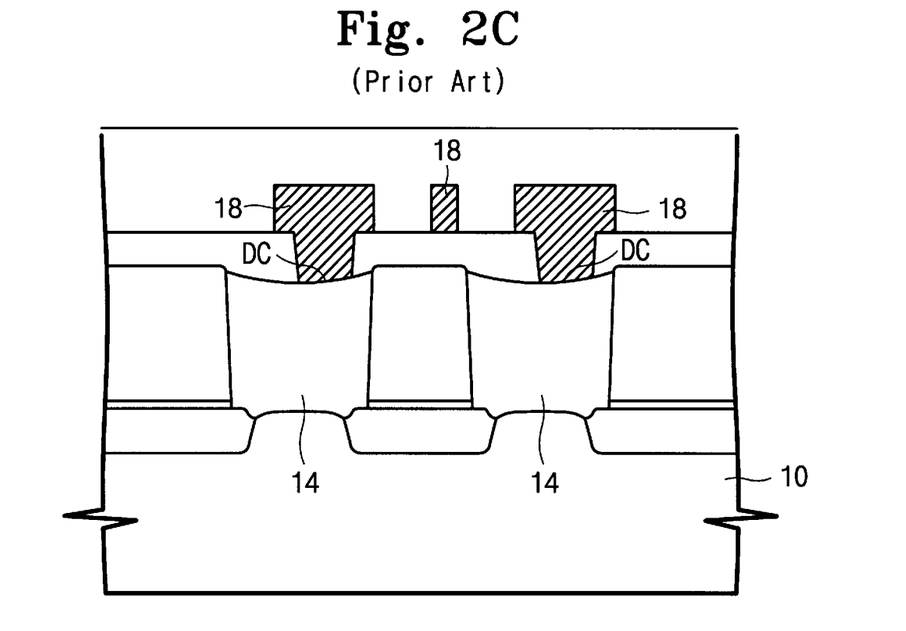

Referring to FIGS. 2A–2C, on the semiconductor substrate 10 are formed a conductive plug 14 (referred to below as a "DC plug") that electrically connects a bit line 18 (referred to below as a "BL") to the semiconductor substrate 10, and a conductive plug 12 (referred to below as a "BC plug") that electrically connects a storage node 16 to the semiconductor substrate 10. After formation of a bit line 18, a contact opening (or contact hole) for forming a storage node 16 is formed. Then the storage node 16 is formed on the BC plug 12, as shown in FIG. 2A. The process steps required to form these features are well known to those skilled in the art.

As the integration level of a semiconductor device (in particular, a DRAM) formed on the semiconductor substrate 10 increases, the depth of the contact opening (for forming a storage node 16 to connect to a BC plug 12) increases and the diameter at the bottom of the contact opening decreases. The height of the contact opening increases in proportion to the decrease in the wiring width of bit line 18. It takes additional etching time to form a deeper contact opening to connect a storage node 16 to a BC plug 12. As a result, the contact opening is overetched so that the upper diameter of the contact opening increases.

If the increased diameter contact opening (i.e., the BC opening) is misaligned, the storage node 16 in the contact opening may be etched in a portion 22 during an etching process for forming the storage node 16. Thus, if a dielectric film (not shown) and a plate electrode (not shown) are formed on an overall surface of the semiconductor substrate 10, it may be impossible to insulate a storage node 16 from the plate electrode because the dielectric characteristics of the dielectric film may be degraded in the portion 22 that is misaligned as a result of overetching. In the worst case, the storage node 16 may fall down due to overetching. Furthermore, the deeper the contact opening is, the more difficult it is to clean an internal portion of the contact opening.

Figure 3A:
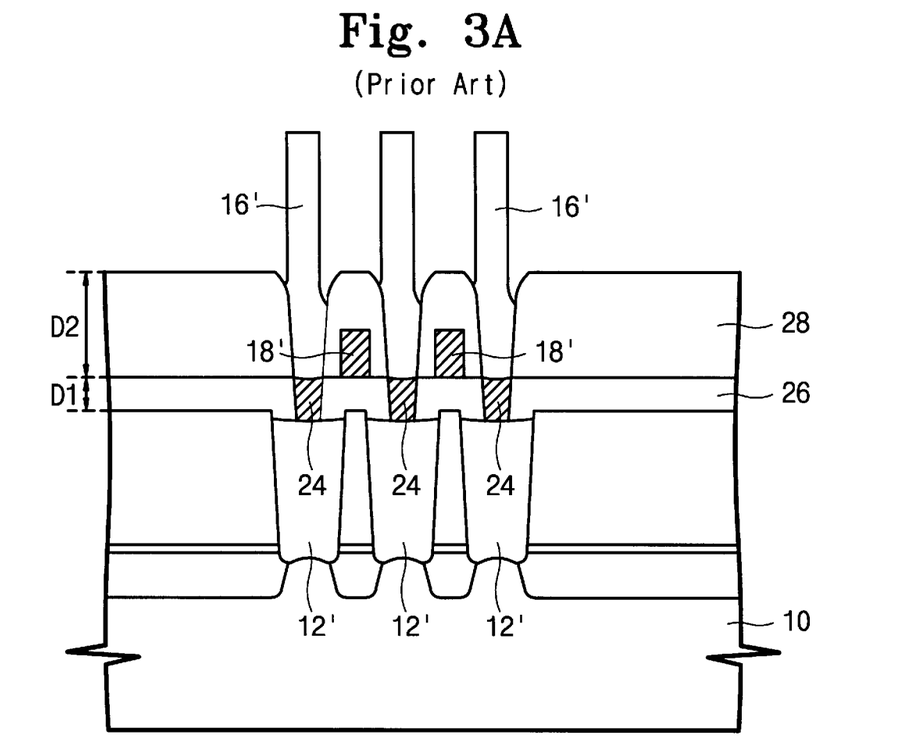
FIGS. 3A–3C are sectional views, illustrating a method for fabricating a DRAM according to another prior art method, taken along lines a–a', b–b', and c–c' of FIG. 1.
Figure 3B:
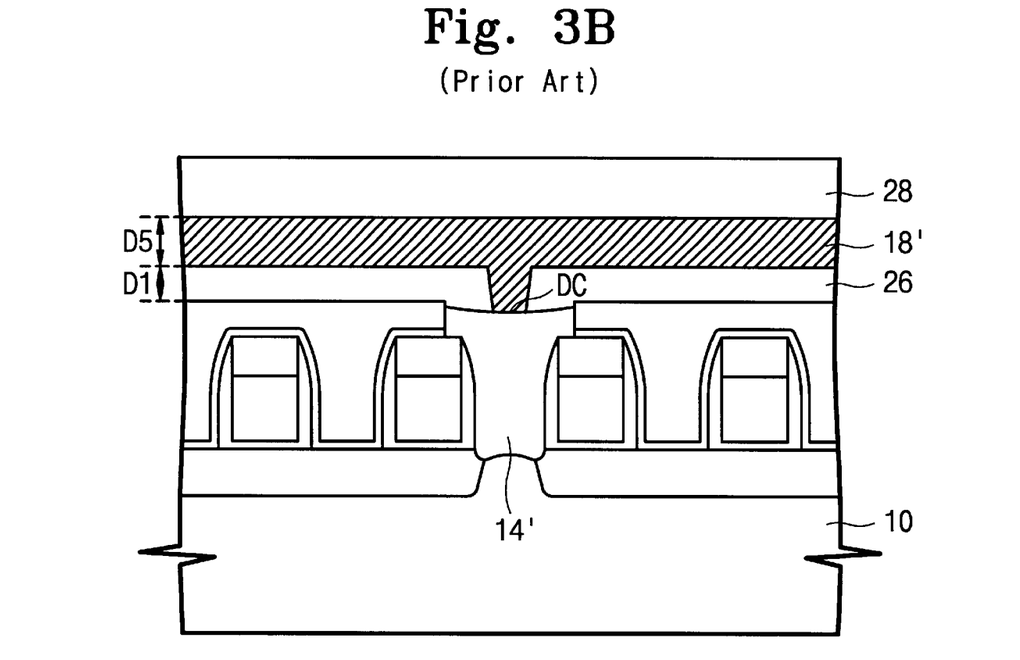
Figure 3C:
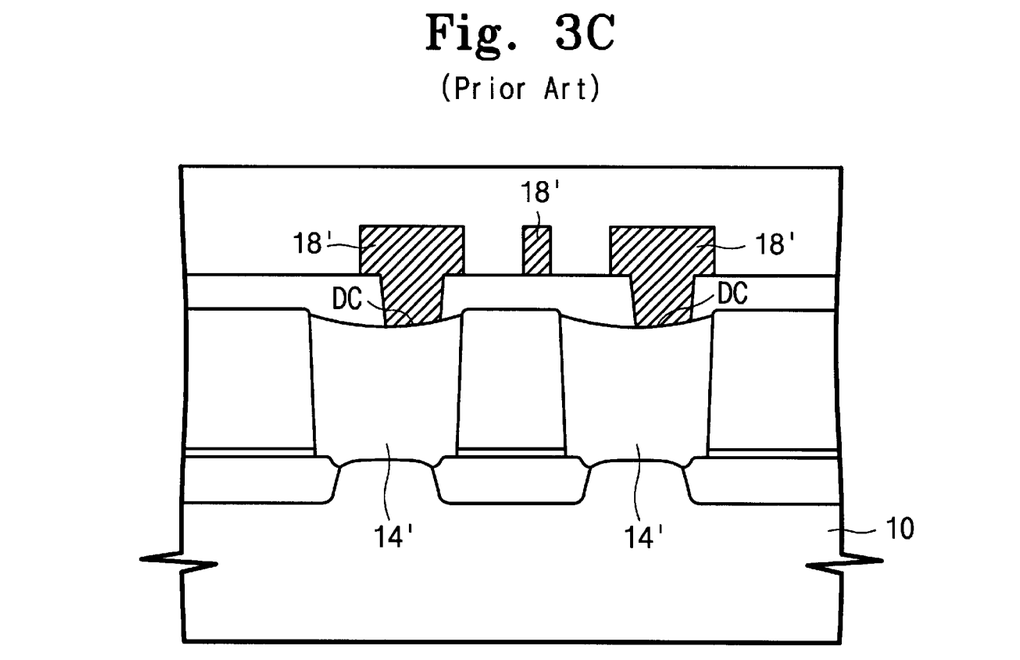

Following is a description of a technique which has been suggested to solve the foregoing problems. Referring to FIGS. 3A–3C, a DC opening is simultaneously formed on a BC formation region (conductive plug 12' for a storage node) with a DC opening. The DC opening connects a bit line 18' to a conductive plug 14'. After formation of bit line material on the overall surface of a semiconductor substrate 10, a bit line 18' is formed using a conventional photo-etching process. At the same time, a plug 24 is also formed at the DC opening on the BC plug 12' from the same material as the bit line 18' by controlling the etching time of the bit line material, as shown in FIG. 3A.

Forming the plug 24 on the BC plug 12' reduces the depth of the BC opening. As shown in FIG. 3A, the depth of the BC opening is reduced as much as the thickness D1 of an insulating layer 26. It is, however, still difficult to overcome the thickness D2 of the bit line 18' and an interlayer insulating film 28 when the BC opening is formed. The prior problems may also occur when the BC contact opening and the storage node 16' are formed.

SUMMARY OF THE INVENTION

The present invention provides a method for fabricating a semiconductor device capable of reducing the etching depth and the diameter of a contact opening. In particular, the invention provides a method for fabricating a storage node contact opening in a DRAM having a reduced depth and a reduced diameter of the contact opening.

According to one aspect of the present invention, one or more insulating layers are formed on a semiconductor substrate having a buried contact plug. The insulating layers are etched down to the buried contact plug to form a first contact opening on the buried contact plug. A photoresist pattern is formed on a top surface of the insulating layers and the first contact opening, and the insulating layers are etched using the photoresist pattern as a mask to form a second contact opening. The first and second contact openings are then filled with a conductive material.

The conductive material in the second contact opening may be a portion of a bit line, and the conductive material may be polysilicon, metal, or metal and polysilicon. The second contact opening preferably does not penetrate the insulating layers. The method may also include forming an additional insulating layer on the top surface of the semiconductor substrate, and etching the additional insulating layer down to the conductive material to form a contact opening on the conductive material for formation of a storage node. In addition, the step of filling the first and second contact openings with a conductive material may include forming the conductive material on a top surface of the insulating layers and the first and second contact openings, and etching the conductive material down to a top surface of the insulating layers.

According to another aspect of the present invention, a first, second, third, and fourth insulating layers are formed on an overall surface of a semiconductor substrate having a plurality of buried contact plugs. First contact openings are formed on the buried contact plugs by etching the fourth, third, second, and first insulating layers down to a top surface of the buried contact plugs. A photoresist pattern is formed on the fourth insulating layer and the first contact openings. Second contact openings are formed on the second insulating layer by etching the fourth and the third insulating layers using the photoresist pattern as a mask. Finally, the first and second contact openings are filled with conductive material.

The second and the fourth insulating layers are may be made of a nitride. The second insulating layer may be formed with a thickness of about 200 to 300 Å, and the fourth insulating layer may be formed with a thickness of 500 Å. The first and the third insulating layers may be made of an oxide. The first insulating layer may be formed with a thickness of 1,000 Å, and the third insulating layer may be formed with a thickness of 2,000 Å. The second insulating layer may serve as an etch-stop layer during formation of the second contact openings. The conductive material in the second contact opening may form a portion of a bit line, and may be polysilicon, metal, or metal and polysilicon.

The method may further include the steps of forming a fifth insulating layer on the overall surface of the semiconductor substrate, and etching the fifth insulating layer down the conductive material to form storage node contact openings on the conductive material. The conductive material may be etched through either an etchback process or a chemical mechanical polishing (CMP) process. The fourth insulating layer may serve as an etch-stop layer when the conductive material is etched.

According to yet another aspect of the present invention, one or more insulating layers are formed on a semiconductor substrate having a buried contact plug. A photoresist pattern is formed on a top surface of the insulating layers, and the insulating layers are etched, using the photoresist pattern as a mask, to form a first contact opening. The insulating layers are then etched down to the buried contact plug to form a second contact opening on the buried contact plug. Finally, the first and second contact openings are filled with a conductive material.

As a result, a conductive plug is formed on a buried contact plug together with a bit line, at the same time.

BRIEF DESCRIPTION OF THE DRAWINGS

The above features and advantages of the invention will become apparent upon reference to the following detailed description of specific embodiments and the attached drawings, of which.

DESCRIPTION OF SPECIFIC EMBODIMENTS

Korean application no. 98-28194, filed Jul. 13, 1998, is hereby incorporated by reference as if fully set forth herein. Specific embodiments of the present invention are shown in the accompanying drawings and describe below.

Figure 4A:
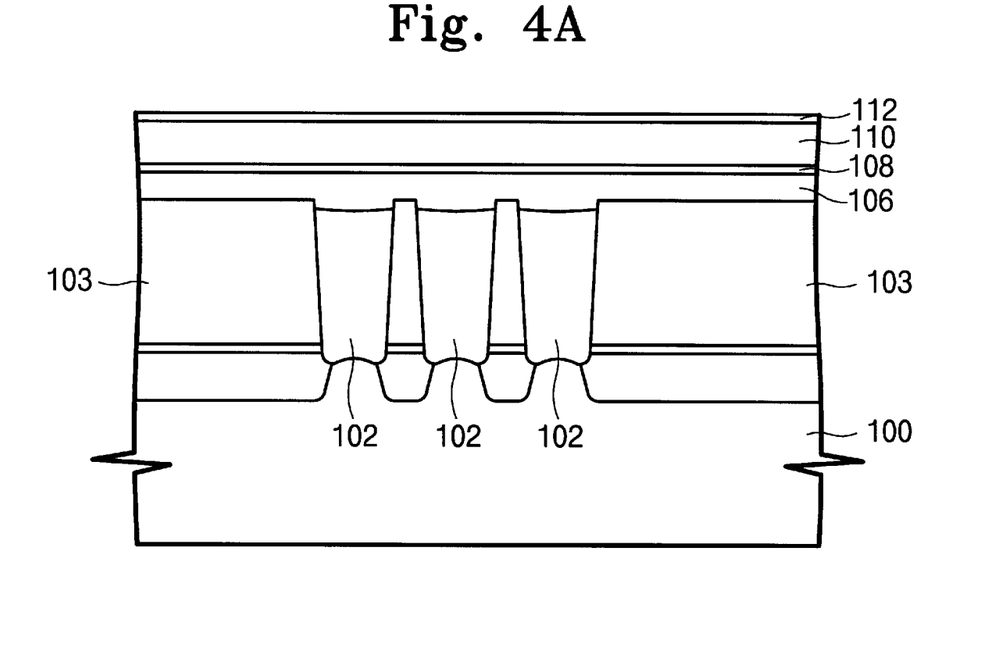
FIGS. 4A–4E are sectional views, illustrating a method for fabricating a DRAM according to the present invention, taken along a line a–a' of FIG. 1.
Figure 5A:
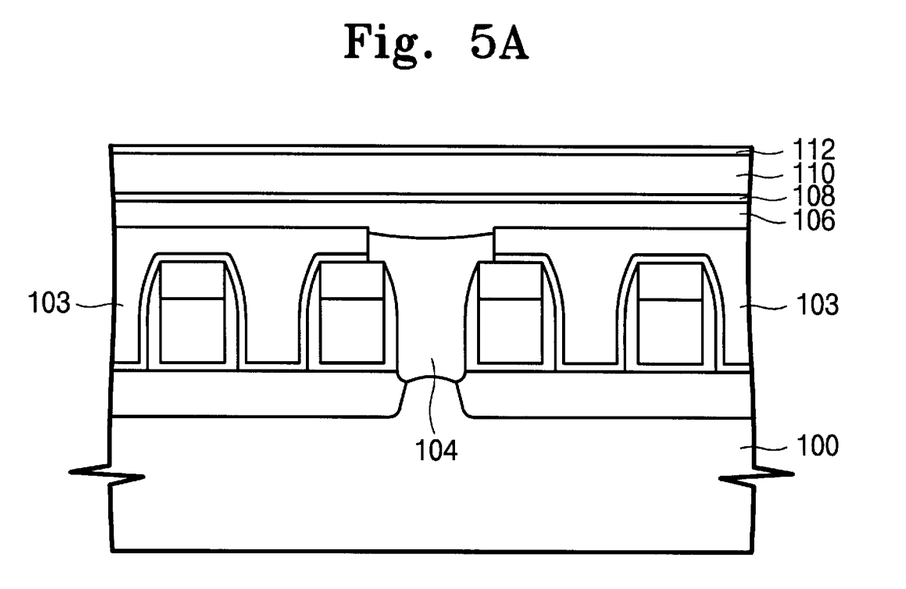
FIGS. 5A–5D are sectional views, illustrating a method for fabricating a DRAM according to the present invention, taken along a line b–b' of FIG. 1.
Figure 6A:
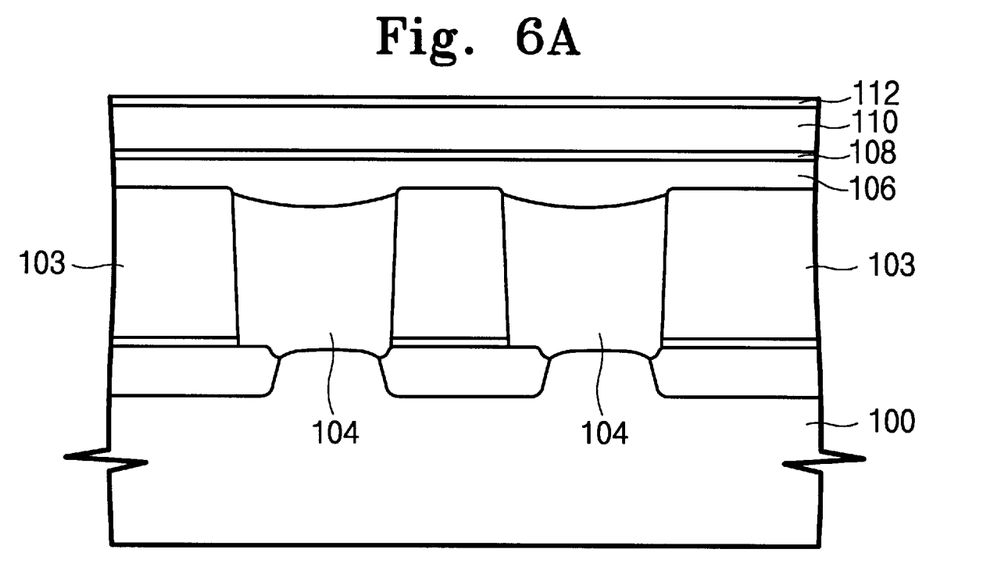
FIGS. 6A–6D are sectional views, illustrating a method for fabricating a DRAM according to the present invention, taken along a line c–c' of FIG. 1.

Referring to FIG. 4A, BC plugs 102 are conventionally formed on a semiconductor substrate 100. Each of the plugs 102 is insulated by an interlayer insulating film 103. When the BC plugs 102 are formed, DC plugs 104 electrically connecting a bit line 118 to the semiconductor substrate 100 are simultaneously formed on the semiconductor substrate 100, as shown in FIG. 5A and FIG. 6A. Conventionally, as shown in FIG. 4A, a first to a fourth insulating layers 106, 108, 110, and 112 are sequentially formed on an overall surface of the semiconductor substrate 100. Each of the first insulating layer 106 and the third insulating layer 110 may be made of an oxide with a thickness of about 1,000 to 2,000 Å. The second insulating layer 108 may be made of silicon nitride with a thickness of about 200 to 300 Å. The fourth insulating layer 112 may be made of silicon nitride with a thickness of about 500 Å.

Figure 4B:
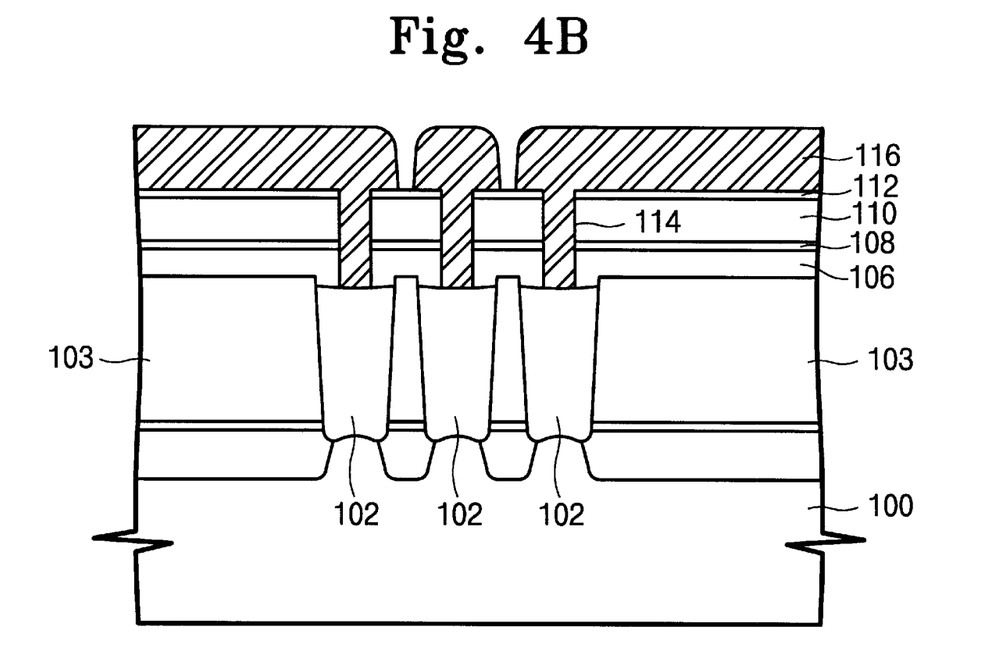
Figure 5B:
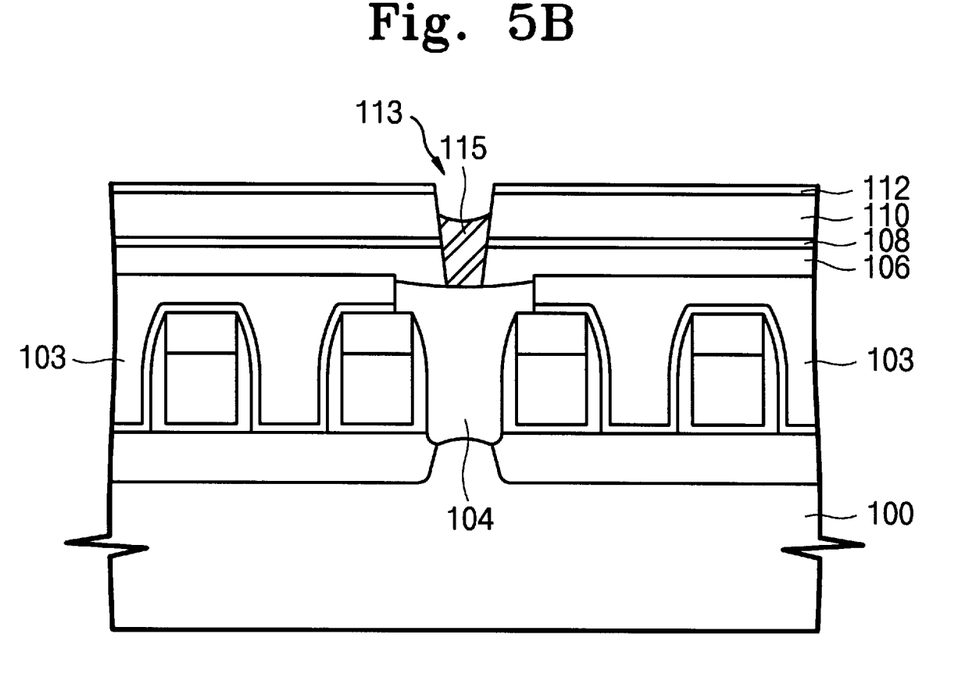
Figure 6B:
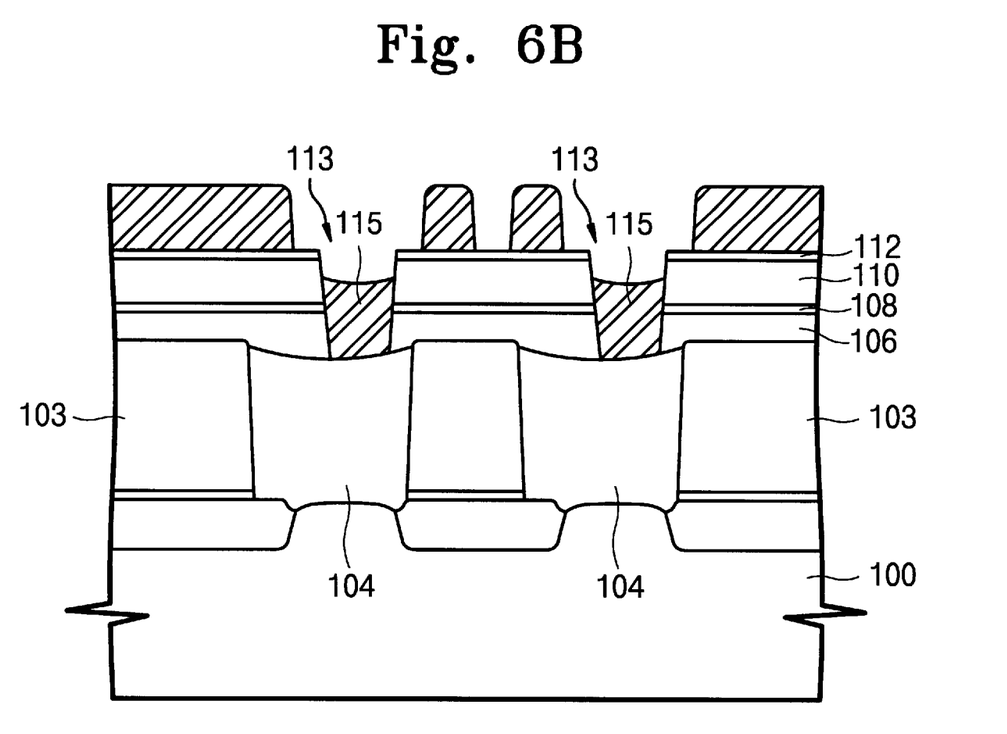

Then, a DC opening connecting a bit line 118 (formed in the following process) to the DC plug 104 is formed by a conventional photo-etching process, as shown in FIG. 5A and FIG. 6A. That is, after formation of a photoresist pattern (not shown) connecting the bit line 118 and the DC plug 104, the fourth to the first insulating layers 112, 110, 108, and 106 are sequentially etched by using the photoresist pattern as a mask. Then, as shown in FIG. 5B and FIG. 6B, a DC opening 113 is formed. As shown in FIG. 4B, a BC opening 114 is formed simultaneously with the DC opening 113.

As shown in FIG. 4B, a photoresist pattern 116 is formed on the fourth insulating layer 112 including BC openings 114. By controlling exposure time and focussing during the process, an undeveloped photoresist pattern 115 is allowed to remain in the DC opening 113, as shown in FIG. 5B and FIG. 6B.

Figure 4C:
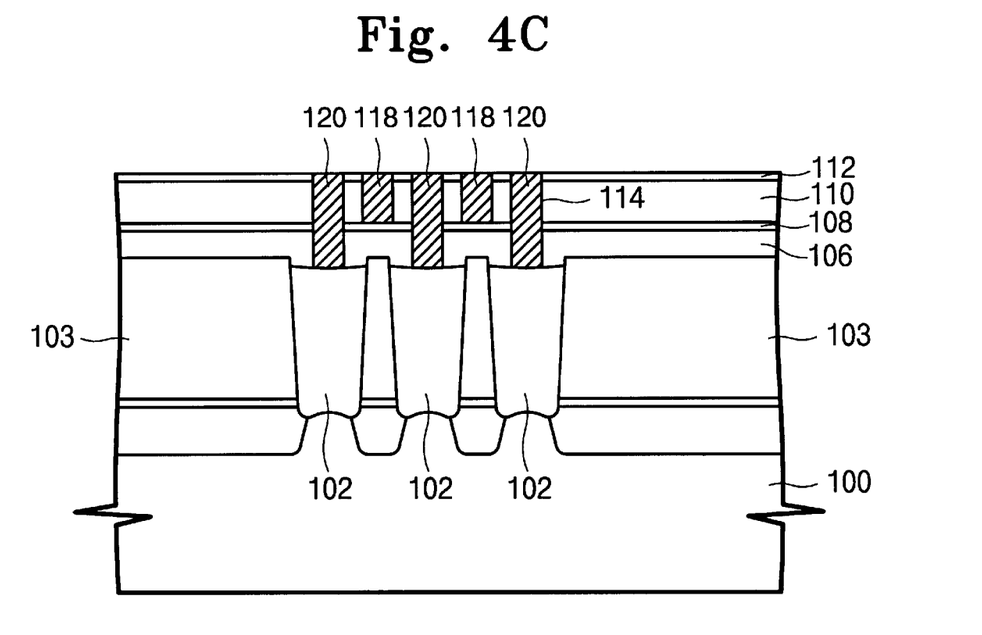

The fourth insulating layer 112 and the third insulating layer 110 are sequentially etched down to a top surface of the second insulating layer 108 by using the photoresist pattern 116 as a mask, as shown in FIG. 4C. The second insulating layer 108 serves as an etch-stop layer. After removal of the photoresist pattern 116, conductive material for a bit line is formed on the overall surface of the semiconductor substrate 100. The conductive material may be polysilicon, metal, or metal layered on polysilicon. The metal may be tungsten (W), titanium nitride (TiN), or titanium silicide (TiSi).

Figure 5C:
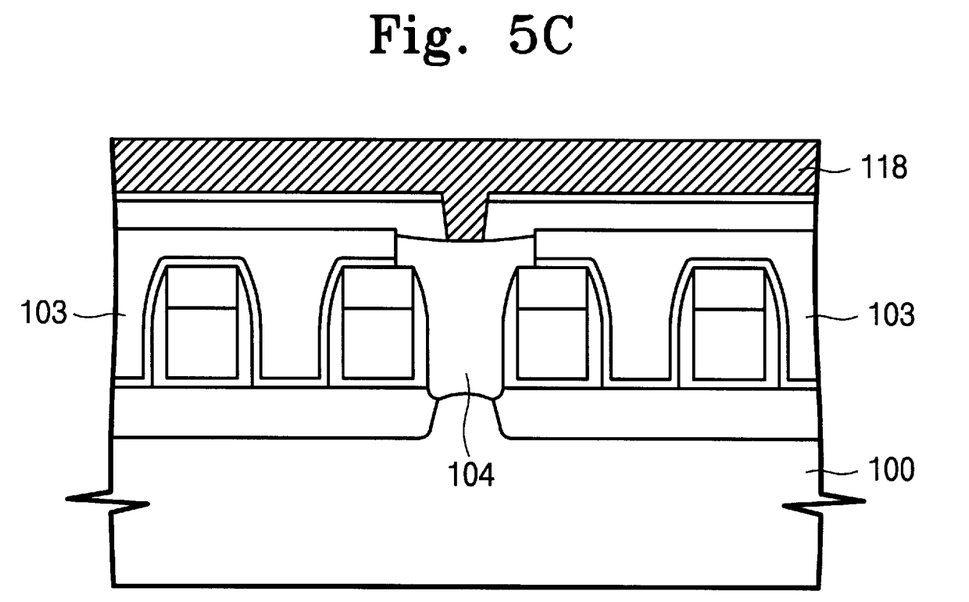
Figure 6C:
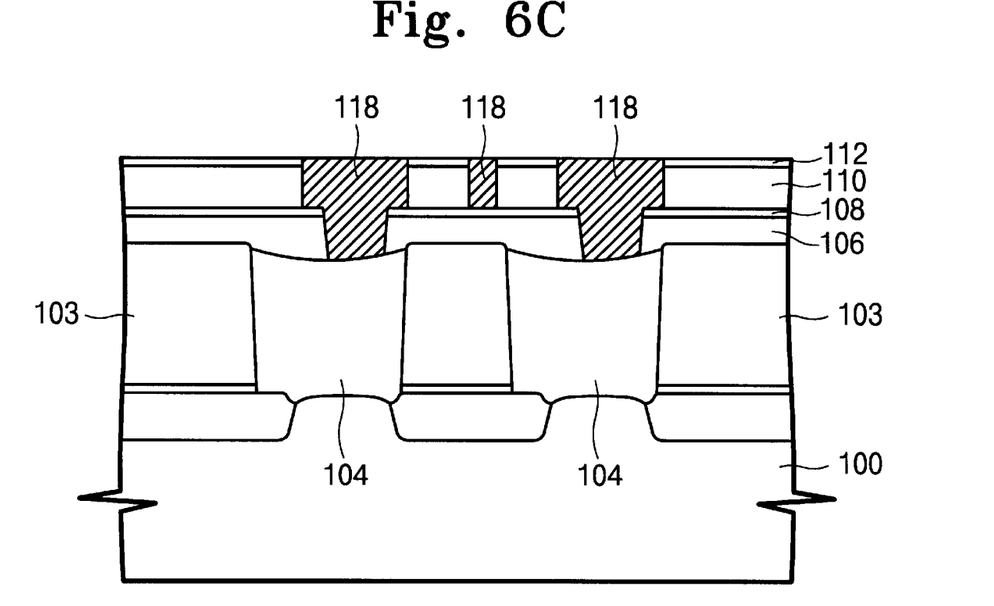

The conductive material fills the holes formed by etching insulating layers 112 and 110 down to insulating layer 108 to form portions of bit lines 118, as shown in FIG. 4C. The bit line 118 is electrically connected to the semiconductor substrate 100 via the DC plug 104, as shown in FIG. 5C and FIG. 6C. At the same time, the conductive material fills the BC openings 114 formed through insulating layers 112, 110, 108, and 106 to form conductive plugs 120 on the BC plug 102, as shown in FIG. 4C. An etchback process or a chemical mechanical polishing (CMP) process is used to remove the excess conductive material and separate the bit lines 118 from the conductive plugs 120, as shown in FIG. 4C. The fourth insulating layer 112 serves as an etch-stop layer.

Figure 4D:
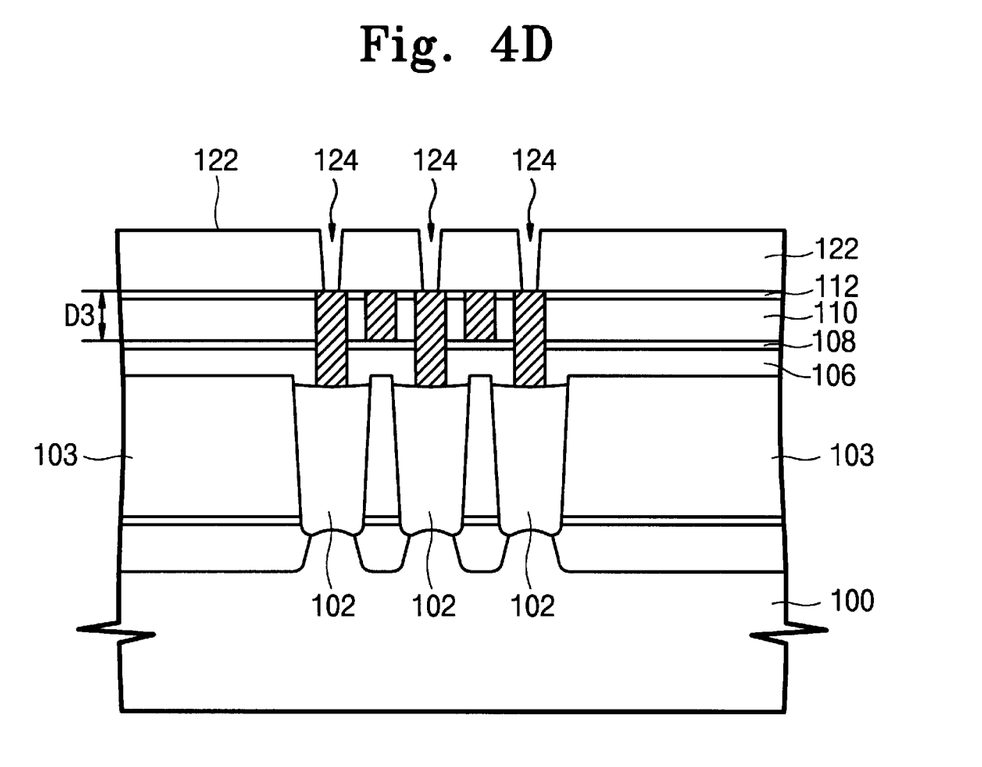
Figure 4E:
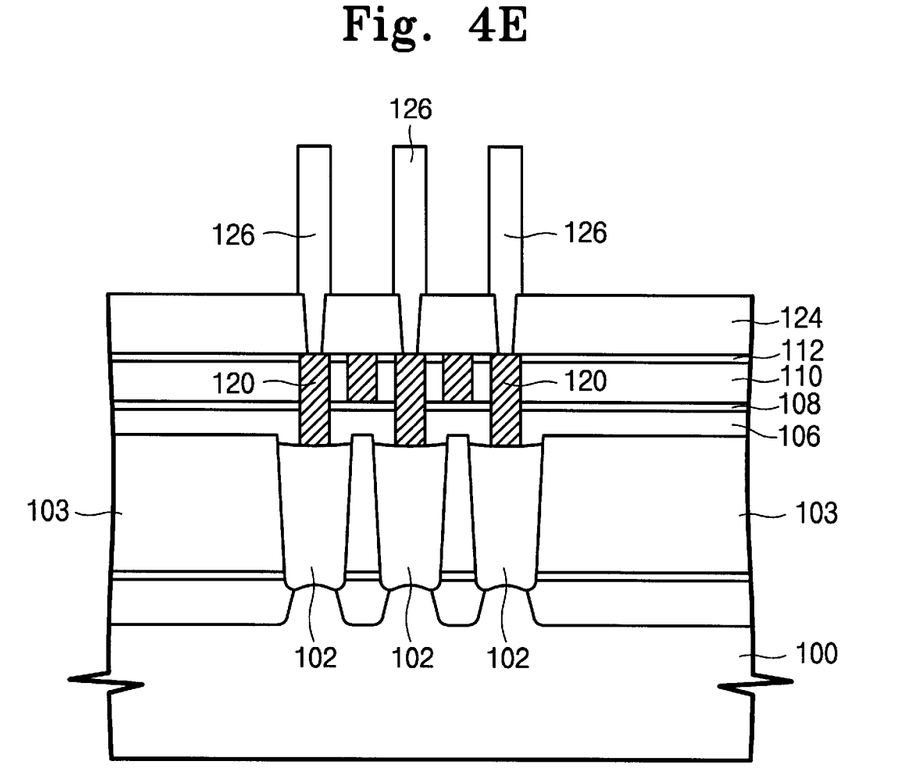
Figure 5D:
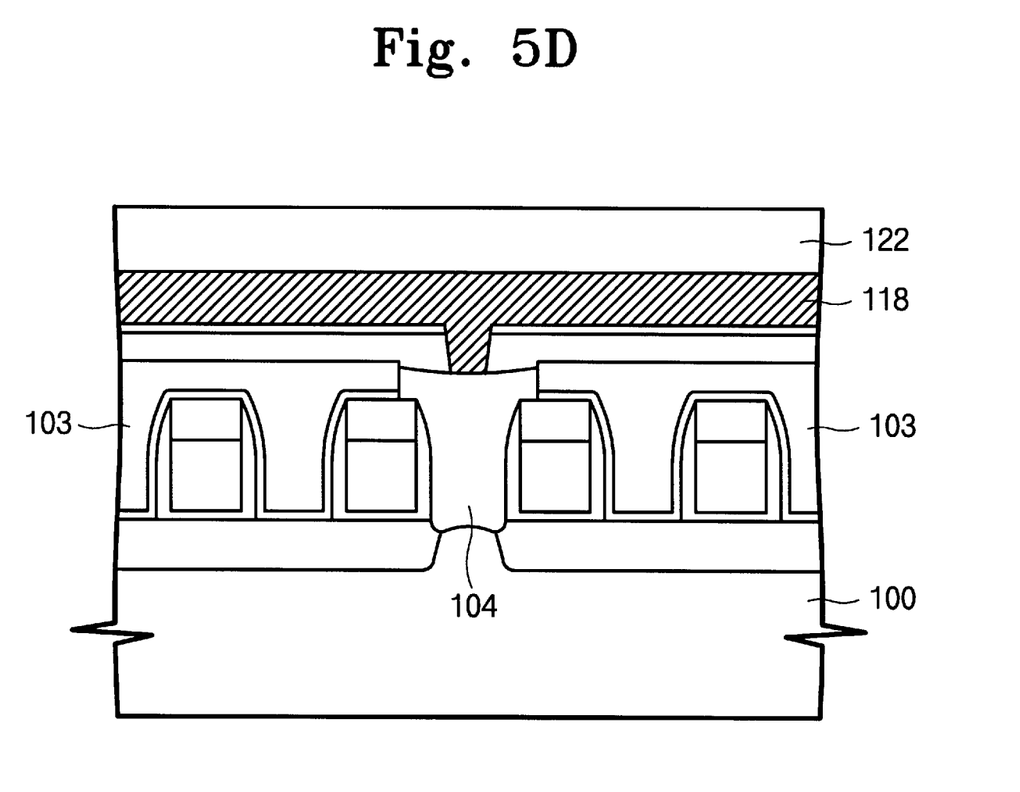
Figure 6D:
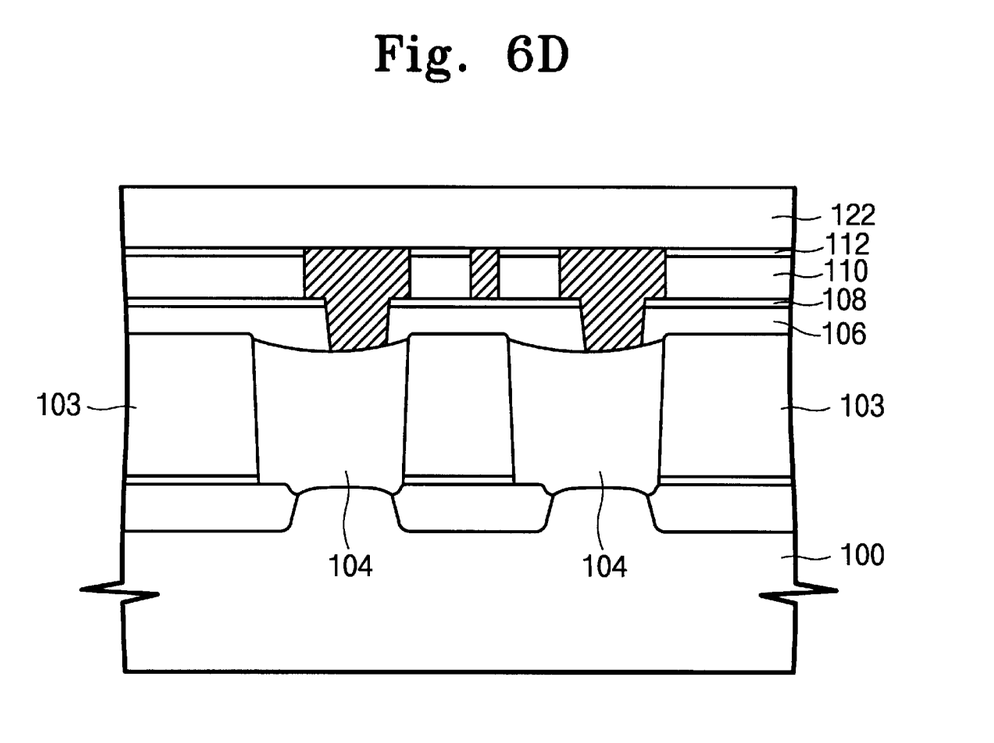

Then, referring to FIGS. 4D, 5D, and 6D, an interlayer insulating film 122 having predetermined thickness is formed on the overall surface of the semiconductor substrate 100. A BC opening 124 is formed on the plug 120 using a conventional photo-etching process. When the BC opening 124 is formed, the depth of the BC opening 124 is reduced compared with the prior method of FIGS. 2A–2C by as much as the sum of the thickness of a bit line 118 and an interlayer insulating film between a bit line and a BC plug. Compared with the prior method of FIGS. 3A–3C, the thickness of the BC opening 124 is reduced by as much as the thickness D3 of a bit line 118. Finally, as shown in FIG. 4E, a storage node 126 is formed electrically connected to the semiconductor substrate 100 via plugs 120 and 102. It will be clear to those skilled in the art that a DC contact may be formed after formation of the bit lines, although being not shown, using the foregoing or similar techniques.

Using the bit line material (i.e. metal, polysilicon, or metal layered on polysilicon) formed before formation of BC openings 124, plugs 120 are formed on the BC plugs directly connected to the semiconductor substrate 100. The plugs 120 are formed at the same time as the bit lines 118, and have a predetermined thickness approximately equal to the thickness of the bit line 118 and the first insulating layer 106. Compared with the prior method of FIGS. 2A–2C, the depth of the BC opening 124 is reduced as much as D4 (shown in FIG. 2A), and compared with the prior method of FIGS. 3A–3C, it is reduced as much as D5 (shown in FIG. 3B). This reduced depth reduces problems such as ineffective insulation of a storage node from a plate electrode (not shown), falling-down of the storage node, cleaning of a deep BC opening, and other problems resulting from misalignment between the storage node 126 and the BC plug 120 when a storage node is formed.

It should be noted that the above description provides for etching the BC openings 114 (in which the conductive plugs 120 are formed) before etching the openings formed by etching insulating layers 112 and 110 down to insulating layer 108 (in which the portions of bit lines 118 are formed). However, the method can be modified to etch the bit line openings before the BC openings.

Thus, a method of forming a contact plug for a DRAM has been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A method for fabricating a semiconductor device comprising:
   forming one or more insulating layers on a semiconductor substrate having a buried contact plug;
   etching the insulating layers down to the buried contact plug to form a first contact opening on the buried contact plug;
   forming a photoresist pattern on a top surface of the insulating layers and the first contact opening;
   etching the insulating layers, using the photoresist pattern as a mask, to form a second contact opening; and
   filling the first and second contact openings with a conductive material,
   wherein the conductive material in the second contact opening comprises a portion of a bit line.

2. The method of claim 1, wherein the conductive material comprises a material selected from the group consisting of polysilicon, metal, and metal layered on polysilicon.

3. The method of claim 1, wherein the second contact opening does not penetrate the insulating layers.

4. The method of claim 1, wherein the method further comprises:
   forming an additional insulating layer on a top surface of the semiconductor substrate; and
   etching the additional insulating layer down to the conductive material to form a contact opening on the conductive material for formation of a storage node.

5. The method of claim 1, wherein the filling of the first and second contact openings with a conductive material further comprises:
   forming the conductive material on a top surface of the insulating layers and the first and second contact openings; and
   etching the conductive material down to a top surface of the insulating layers.

6. A method for fabricating a semiconductor device comprising:
   forming first, second, third, and fourth insulating layers on an overall surface of a semiconductor substrate having a plurality of buried contact plugs;
   etching the fourth, third, second, and first insulating layers down to a top surface of the buried contact plugs to form first contact openings on the buried contact plugs;
   forming a photoresist pattern on the fourth insulating layer and the first contact openings;
   etching the fourth and third insulating layers by using the photoresist pattern as a mask, to form second contact openings; and
   filling the first and second contact openings with a conductive material.

7. The method of claim 6, wherein the second and the fourth insulating layers comprise nitride, the second insulating layer is formed with a thickness of from about 200 to about 300 Å, and the fourth insulating layer is formed with a thickness of about 500 Å.

8. The method of claim 6, wherein the first and third insulating layers comprise an oxide, the first insulating layer is formed to a thickness of about 1,000 Å, and the third insulating layer is formed to a thickness of about 2,000 Å.

9. The method of claim 6, wherein the second insulating layer serves as an etch-stop layer during formation of the second contact openings.

10. The method of claim 6, wherein the conductive material in the second contact opening comprises a portion of a bit line, and comprises a material selected from the group consisting of polysilicon, metal, and metal layered on polysilicon.

11. The method of claim 6, wherein the conductive material comprises a material selected from the group consisting of polysilicon, tungsten, titanium nitride, and titanium silicide.

12. The method of claim 6, wherein the method further comprises:
   forming a fifth insulating layer on the overall surface of the semiconductor substrate; and
   etching said fifth insulating layer down to the conductive material to form contact openings on the conductive material for formation of storage nodes.

13. The method of claim 6, wherein the filling of the conductive material comprises:
   forming the conductive material on the overall surface of the semiconductor substrate; and
   etching the conductive material down to a top surface of the fourth insulating layer.

14. The method of claim 13, wherein the conductive material is etched using a process selected from the group consisting of an etchback process and a chemical mechanical polishing process.

15. The method of claim 14, wherein the fourth insulating layer serves as an etch-stop layer when the conductive material is etched.

* * * * *